(12) United States Patent
Yamashita

(10) Patent No.: US 12,103,111 B2
(45) Date of Patent: Oct. 1, 2024

(54) PROCESSING APPARATUS AND PROCESSING METHOD

(71) Applicant: Tokyo Electron Limited, Tokyo (JP)

(72) Inventor: Yohei Yamashita, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 344 days.

(21) Appl. No.: 17/436,795

(22) PCT Filed: Mar. 2, 2020

(86) PCT No.: PCT/JP2020/008615
§ 371 (c)(1),
(2) Date: Sep. 7, 2021

(87) PCT Pub. No.: WO2020/195567
PCT Pub. Date: Oct. 1, 2020

(65) Prior Publication Data
US 2022/0168850 A1    Jun. 2, 2022

(30) Foreign Application Priority Data

Mar. 28, 2019  (JP) .................................. 2019-064378

(51) Int. Cl.
*B23K 26/53*    (2014.01)
*B23K 26/03*    (2006.01)
(Continued)

(52) U.S. Cl.
CPC .......... *B23K 26/53* (2015.10); *B23K 26/0344* (2015.10); *B23K 26/062* (2015.10); *B23K 26/0823* (2013.01)

(58) Field of Classification Search
CPC .. B23K 26/53; B23K 26/0344; B23K 26/062; B23K 26/0823; B23K 2101/40;
(Continued)

(56) References Cited

U.S. PATENT DOCUMENTS

2015/0140785 A1    5/2015    Kwak

FOREIGN PATENT DOCUMENTS

| JP | H9216152 A | 8/1997 |
| JP | 2004111606 A | 4/2004 |

(Continued)

OTHER PUBLICATIONS

International Search Report of PCT/JP2020/008615 dated May 19, 2020.
(Continued)

*Primary Examiner* — S. Behrooz Ghorishi
(74) *Attorney, Agent, or Firm* — Shih IP Law Group, PLLC.

(57) ABSTRACT

In forming modification layers by radiating laser light to an inside of a processing target object from a modifying device periodically while rotating the processing target object held by a holder relative to the modifying device by a rotating mechanism and by moving the modifying device relative to the holder in a diametrical direction by a moving mechanism, a boundary position of the laser light in the diametrical direction is calculated, the boundary position being a position where a circumferential distance between the modification layers becomes a required threshold value, and a diametrical distance between the modification layers is reduced in a moving direction of the modifying device from the boundary position and/or a frequency of the laser light is reduced.

14 Claims, 13 Drawing Sheets

(51) Int. Cl.
*B23K 26/062* (2014.01)
*B23K 26/08* (2014.01)

(58) Field of Classification Search
CPC ............ B23K 2103/54; B23K 2103/56; B23K 26/0622; B23K 26/08; B23K 26/0869; B23K 26/55; B23K 26/70; B23K 37/04; B23K 37/0443; B23K 26/0006; B23K 2101/42; H01L 21/304; H01L 21/67092
See application file for complete search history.

(56) References Cited

FOREIGN PATENT DOCUMENTS

| | | | |
|---|---|---|---|
| JP | 2006108532 A | | 4/2006 |
| JP | 2009131942 A | | 6/2009 |
| JP | 2009135342 A | | 6/2009 |
| JP | 2011159798 A | | 8/2011 |
| JP | 2012064667 A | | 3/2012 |
| JP | 2012069736 A | | 4/2012 |
| JP | 2013049161 A | * | 3/2013 |
| JP | 2014167966 A | | 9/2014 |
| JP | 2015516672 A | | 6/2015 |
| JP | 2017024039 A | | 2/2017 |
| JP | 2017071074 A | | 4/2017 |
| JP | 2017191825 A | | 10/2017 |
| JP | 2018043340 A | | 3/2018 |
| WO | 2013126927 A2 | | 8/2013 |
| WO | WO-2019044588 A1 | * | 3/2019 ............ B23K 26/53 |

OTHER PUBLICATIONS

International Search Report of PCT/JP2019/028310 dated Oct. 8, 2019.
International Search Report of PCT/JP2019/008120 dated May 28, 2019.

* cited by examiner

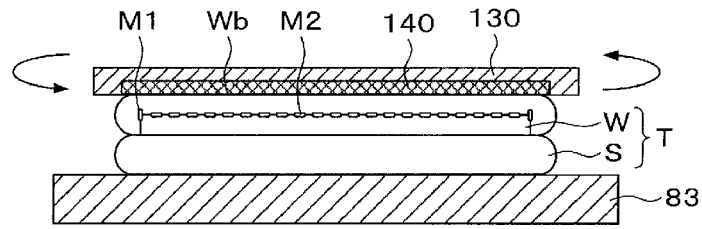
FIG. 13A
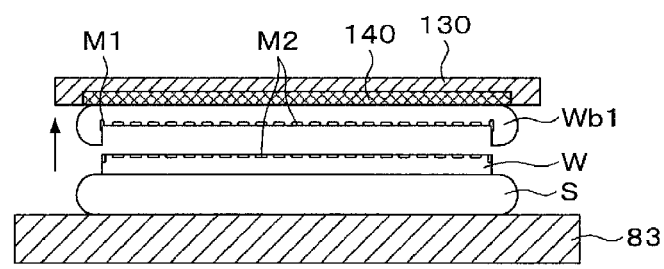
FIG. 13B
FIG. 14
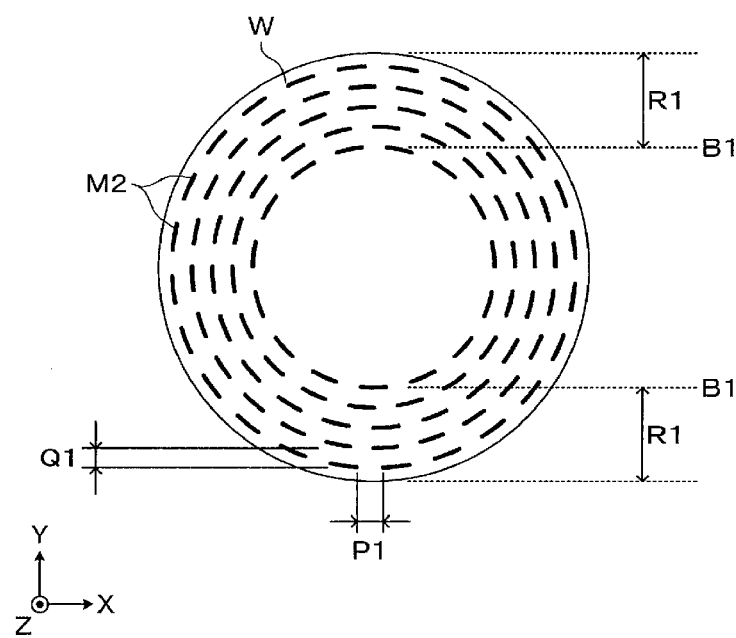

PROCESSING APPARATUS AND PROCESSING METHOD

CROSS-REFERENCE TO RELATED APPLICATIONS

This Application is a U.S. national phase application under 35 U.S.C. § 371 of PCT Application No. PCT/JP2020/008615 filed on Mar. 2, 2020, which claims the benefit of Japanese Patent Application No. 2019-064378 filed on Mar. 28, 2019, the entire disclosures of which are incorporated herein by reference.

TECHNICAL FIELD

The various aspects and embodiments described herein pertain generally to a processing apparatus and a processing method.

BACKGROUND

Patent Document 1 discloses a manufacturing method for a stacked semiconductor device. In this manufacturing method, the stacked semiconductor device is produced by stacking two or more semiconductor wafers. At this time, after each semiconductor wafer is stacked on another semiconductor wafer, a rear surface of the semiconductor wafer is ground so that it has a required thickness.

PRIOR ART DOCUMENT

Patent Document 1: Japanese Patent Laid-open Publication No. 2012-069736

Means for Solving the Problems

In an exemplary embodiment, a processing apparatus configured to process a processing target object includes a holder configured to hold the processing target object; a modifying device configured to radiate laser light to an inside of the processing target object held by the holder to form modification layers along a plane direction thereof; a rotating mechanism configured to rotate the holder and the modifying device relatively; a moving mechanism configured to move the holder and the modifying device relatively in a horizontal direction; and a controller configured to control the holder, the modifying device, the rotating mechanism and the moving mechanism. In forming the modification layers by radiating the laser light to the inside of the processing target object from the modifying device periodically while rotating the processing target object held by the holder relative to the modifying device by the rotating mechanism and by moving the modifying device relative to the holder in a diametrical direction by the moving mechanism, the controller calculates a boundary position of the laser light in the diametrical direction, the boundary position being a position where a circumferential distance between the modification layers becomes a required threshold value, and the controller controls the holder, the modifying device, the rotating mechanism and the moving mechanism to reduce a diametrical distance between the modification layers in a moving direction of the modifying device from the boundary position and/or to reduce a frequency of the laser light.

BRIEF DESCRIPTION OF THE DRAWINGS

FIG. 13A and FIG. 13B are explanatory diagrams showing a state in which a rear surface wafer is being separated from the processing target wafer.

FIG. 14 is an explanatory diagram showing a state in which the internal modification layer is being formed in the processing target wafer.

DETAILED DESCRIPTION

Figure 1:
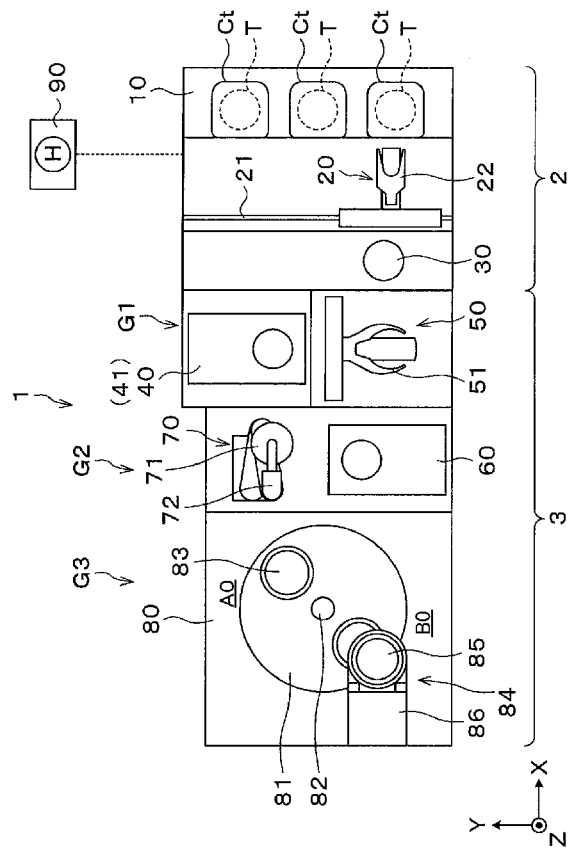
FIG. 1 is a plan view illustrating a configuration of a wafer processing system according to an exemplary embodiment.

In a manufacturing process for a semiconductor device, a semiconductor wafer having, for example, a plurality of devices such as electronic circuits on a front surface thereof is thinned by grinding a rear surface of the wafer, as described in Patent Document 1, for example.

The grinding of the rear surface of the wafer is performed by rotating the wafer and a grinding whetstone and lowering the grinding whetstone in a state that the grinding whetstone is in contact with the rear surface of the wafer, for example. In this case, since the grinding whetstone is worn away, it needs to be replaced regularly. Further, since grinding water is used in the grinding processing, disposal of a waste liquid is also required.

In this regard, a modification layer is formed by radiating laser light to an inside of the wafer along a plane direction thereof, and the wafer is separated starting from the modification layer. In this case, a laser head used to radiate the laser light is hardly degraded with a lapse of time, which results in fewer consumables and reduction of the maintenance frequency. Furthermore, since this processing is a dry-process using the laser light, disposal of waste water and grinding water is not required. In the thinning processing using this laser light, however, there is still a room for improvement in terms of throughput.

The present disclosure provides a technique capable of performing the thinning processing of the wafer efficiently by shortening a time required for the thinning processing. Hereinafter, a wafer processing system equipped with a modifying apparatus as a processing apparatus and a wafer processing method as a processing method according to an exemplary embodiment capable of performing the thinning processing efficiently will be described with reference to the accompanying drawings. Further, in the present specification and the drawings, parts having substantially same functional configurations will be assigned same reference numerals, and redundant description thereof will be omitted.

First, a configuration of the wafer processing system according to the present exemplary embodiment will be described. FIG. 1 is a plan view illustrating a schematic configuration of a wafer processing system 1.

Figure 2:
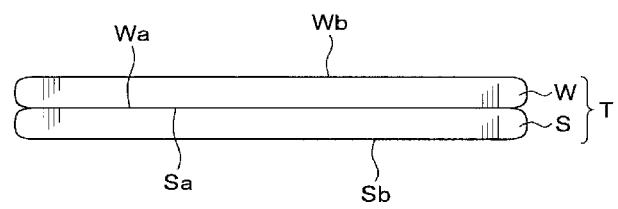
FIG. 2 is a side view illustrating a schematic structure of a combined wafer.
Figure 3:
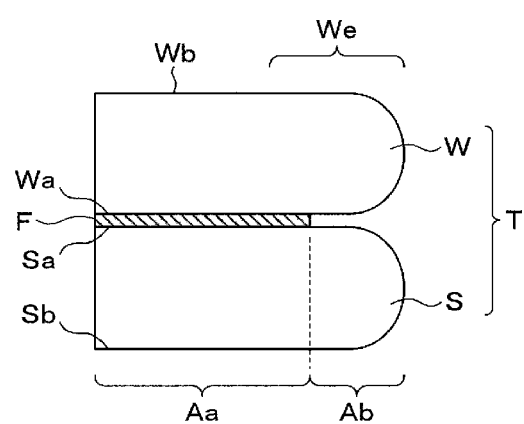
FIG. 3 is a side view illustrating a schematic structure of a part of the combined wafer.

The wafer processing system 1 performs a required processing on a combined wafer T as a combined substrate in which a processing target wafer W as a first substrate and a support wafer S as a second substrate are bonded to each other, as illustrated in FIG. 2 and FIG. 3. In the wafer processing system 1, a peripheral portion We of the processing target wafer W is removed, and the processing target wafer W is thinned. Hereinafter, in the processing target wafer W, a surface bonded to the support wafer S will be referred to as "front surface Wa," and a surface opposite to the front surface Wa will be referred to as "rear surface Wb." Likewise, in the support wafer S, a surface bonded to the processing target wafer W will be referred to as "front surface Sa," and a surface opposite to the front surface Sa will be referred to as "rear surface Sb". Further, the processing target wafer W in the present exemplary embodiment corresponds to a processing target object of the present disclosure.

The processing target wafer W is a semiconductor wafer such as, but not limited to, a silicon wafer, and has, on the front surface Wa thereof, a device layer (not shown) including a plurality of devices. Further, an oxide film F, for example, a $SiO_2$ film (TEOS film) is further formed on the device layer. The peripheral portion We of the processing target wafer W is chamfered, and a thickness of the peripheral portion We decreases toward a leading end thereof on a cross section thereof. Here, the peripheral portion We is a portion to be removed by edge trimming and ranges from, e.g., 1 mm to 5 mm from an edge of the processing target wafer W in a diametrical direction thereof.

In FIG. 2, for the sake of simplicity of illustration, illustration of the oxide film F is omitted. In the other drawings recited in the following description, illustration of the oxide film F may sometimes be omitted as well.

The support wafer S is a wafer configured to support the processing target wafer W, and is, for example, a silicon wafer. An oxide film (not shown) is formed on the front surface Sa of the support wafer S. Further, the support wafer S serves as a protection member which protects the devices on the front surface Wa of the processing target wafer W. Further, if the support wafer S has a plurality of devices on the front surface Sa thereof, a device layer (not shown) is formed on the front surface Sa, the same as in the processing target wafer W.

Here, if the processing target wafer W and the support wafer S are bonded at the peripheral portion We of the processing target wafer W, the peripheral portion We may not be removed appropriately. For the reason, at an interface between the processing target wafer W and the support wafer S, a bonding region Aa where the oxide film F and the front surface Sa of the support wafer S are bonded and a non-bonding region Ab are formed. The non-bonding region Ab is located at an outside of the bonding region Aa in the diametrical direction. Since this non-bonding region Ab is provided, the peripheral portion We can be appropriately removed. Further, an outer end portion of the bonding region Aa is located slightly outer than an inner end portion of the peripheral portion We to be removed in the diametrical direction.

Further, the non-bonding region Ab is formed before the bonding, for example. That is, prior to the bonding, a processing of reducing a bonding strength for the front surface Sa of the support wafer S is performed at an outer peripheral portion of the oxide film F. To be specific, a surface layer of the outer peripheral portion of the oxide film F may be removed by grinding, wet-etching, or the like. Alternatively, a surface of the outer peripheral portion may be hydrophobized or roughened with laser.

Furthermore, the non-bonding region Ab may be formed after the bonding, for example. By way of example, after the bonding, by radiating laser light to the outer peripheral portion of the oxide film F, a bonding strength for the front surface Sa of the support wafer S may be reduced.

As depicted in FIG. 1, the wafer processing system 1 includes a carry-in/out station 2 and a processing station 3 connected as one body. In the carry-in/out station 2, a cassette Ct capable of accommodating therein a multiple number of combined wafers T is carried to/from the outside, for example. The processing station 3 is equipped with various kinds of processing apparatuses configured to perform required processings on the combined wafers T.

A cassette placing table 10 is provided in the carry-in/out station 2. In the shown example, a plurality of, for example, three cassettes Ct can be arranged on the cassette placing table 10 in a row in the Y-axis direction. Further, the number of the cassettes Ct placed on the cassette placing table 10 is not limited to the example of the present exemplary embodiment but can be selected as required.

In the carry-in/out station 2, a wafer transfer device 20 is provided adjacent to the cassette placing table 10 at a negative X-axis side of the cassette placing table 10. The wafer transfer device 20 is configured to be movable on a transfer path 21 which is elongated in the Y-axis direction. Further, the wafer transfer device 20 is equipped with, for example, two transfer arms 22 each of which is configured to hold and transfer the combined wafer T. Each transfer arm 22 is configured to be movable in a horizontal direction and a vertical direction and pivotable around a horizontal axis and a vertical axis. Further, the configuration of the transfer arm 22 is not limited to the exemplary embodiment, and various other configurations may be adopted. The wafer transfer device 20 is configured to be capable of transferring the combined wafer T to/from the cassette Ct of the cassette placing table 10 and a transition device 30 to be described later.

In the carry-in/out station 2, the transition device 30 configured to deliver the combined wafer T is provided adjacent to the wafer transfer device 20 at a negative X-axis side of the wafer transfer device 20.

The processing station 3 is provided with, for example, three processing blocks G1 to G3. The first processing block G1, the second processing block G2 and the third processing block G3 are arranged side by side in this sequence from a positive X-axis side (from a carry-in/out station 2 side) toward a negative X-axis side.

The first processing block G1 is equipped with an etching apparatus 40, a cleaning apparatus 41 and a wafer transfer device 50. The etching apparatus 40 and the cleaning apparatus 41 are stacked on top of each other. Further, the number and the layout of the etching apparatus 40 and the cleaning apparatus 41 are not limited to the shown example. By way of example, the etching apparatus 40 and the cleaning apparatus 41 may be elongated in the X-axis direction and arranged side by side when viewed from the top. Further, a plurality of etching apparatuses 40 and a plurality of cleaning apparatuses 41 may be respectively stacked on top of each other.

The etching apparatus 40 is configured to etch the rear surface Wb of the processing target wafer W grounded by a processing apparatus 80 to be described later. By way of example, by supplying a chemical liquid (etching liquid) onto the rear surface Wb, the rear surface Wb is wet-etched. For instance, HF, $HNO_3$, $H_3PO_4$, TMAH, Choline, KOH, or the like may be used.

The cleaning apparatus 41 is configured to clean the rear surface Wb of the processing target wafer W grounded by the processing apparatus 80 to be described later. By way of example, by bringing a brush into contact with the rear surface Wb, the rear surface Wb is scrub-cleaned. Furthermore, a pressurized cleaning liquid may be used for the cleaning of the rear surface Wb. In addition, the cleaning apparatus 41 may be configured to clean the rear surface Sb of the support wafer S as well as the rear surface Wb of the processing target wafer W.

The wafer transfer device 50 is disposed at, for example, a negative Y-axis side of the etching apparatus 40 and the cleaning apparatus 41. The wafer transfer device 50 has, for example, two transfer arms 51 each of which is configured to hold and transfer the combined wafer T. Each transfer arm 51 is configured to be movable in a horizontal direction and a vertical direction and pivotable around a horizontal axis and a vertical axis. Further, the configuration of the transfer arm 51 is not limited to the exemplary embodiment, and various other configurations may be adopted. Additionally, the wafer transfer device 50 is configured to be capable of transferring the combined wafer T to/from the transition device 30, the etching apparatus 40, the cleaning apparatus 41 and a modifying apparatus 60 to be described later.

The second processing block G2 is equipped with the modifying apparatus 60 and a wafer transfer device 70. Further, the number and the layout of the modifying apparatus 60 is not limited to the example of the present exemplary embodiment, and a plurality of modifying apparatuses 60 may be stacked on top of each other.

The modifying apparatus 60 is configured to form a peripheral modification layer and an internal modification layer by radiating laser light to an inside of the processing target wafer W. A specific configuration of the modifying apparatus 60 will be elaborated later.

The wafer transfer device 70 is disposed at, for example, a positive Y-axis side of the modifying apparatus 60. The wafer transfer device 70 is equipped with, for example, two transfer arms 71 each of which is configured to hold and transfer the combined wafer T. Each transfer arm 71 is supported at a multi-joint arm member 72 and configured to be movable in a horizontal direction and a vertical direction and pivotable around a horizontal axis and a vertical axis. A specific configuration of the transfer arm 71 will be elaborated later. The wafer transfer device 70 is configured to be capable of transferring the combined wafer T to/from the cleaning apparatus 41, the modifying apparatus 60 and the processing apparatus 80 to be described later.

The third processing block G3 is equipped with the processing apparatus 80. The number and the layout of the processing apparatus 80 is not limited to the example of the present exemplary embodiment, and a plurality of processing apparatuses 80 may be arranged as required.

The processing apparatus 80 is configured to grind the rear surface Wb of the processing target wafer W. Further, the processing apparatus 80 is configured to remove, in the rear surface Wb having the internal modification layer formed therein, the corresponding internal modification layer, and also removes the peripheral modification layer.

The processing apparatus 80 has a rotary table 81. The rotary table 81 is configured to be rotated around a vertical rotation center line 82 by a rotating mechanism (not shown). Two chucks 83 each configured to attract and hold the combined wafer T are provided on the rotary table 81. The chucks 83 are arranged on a circle concentric with the rotary table 81 at a regular distance therebetween. The two chucks 83 are configured to be moved to a delivery position A0 and a processing position B0 as the rotary table 81 is rotated. Further, each of the two chucks 83 is configured to be rotated around a vertical axis by a rotating mechanism (not shown).

At the delivery position A0, delivery of the combined wafer T is performed. The grinding unit 84 is provided at the processing position B0. In the grinding unit 84, the rear surface Wb of the processing target wafer W is ground. The grinding unit 84 is equipped with a grinder 85 having a grinding whetstone (not shown) configured to be rotated in a ring shape. Further, the grinder 85 is configured to be moved in a vertical direction along a supporting column 86. By respectively rotating the chuck 83 and the grinding whetstone while keeping the rear surface Wb of the processing target wafer W held by the chuck 83 in contact with the grinding whetstone, the rear surface Wb is ground.

The above-described wafer processing system 1 is equipped with a control device 90 as a controller. The control device 90 is implemented by, for example, a computer, and includes a program storage (not shown). A program for controlling a processing of the combined wafer T in the wafer processing system 1 is stored in the program storage. Further, the program storage also stores therein a program for implementing a wafer processing to be described later in the wafer processing system 1 by controlling the above-described various processing apparatuses and a driving system such as the transfer devices. Further, the programs may be recorded in a computer-readable recording medium H, and may be installed from this recording medium H to the control device 90.

Figure 4:
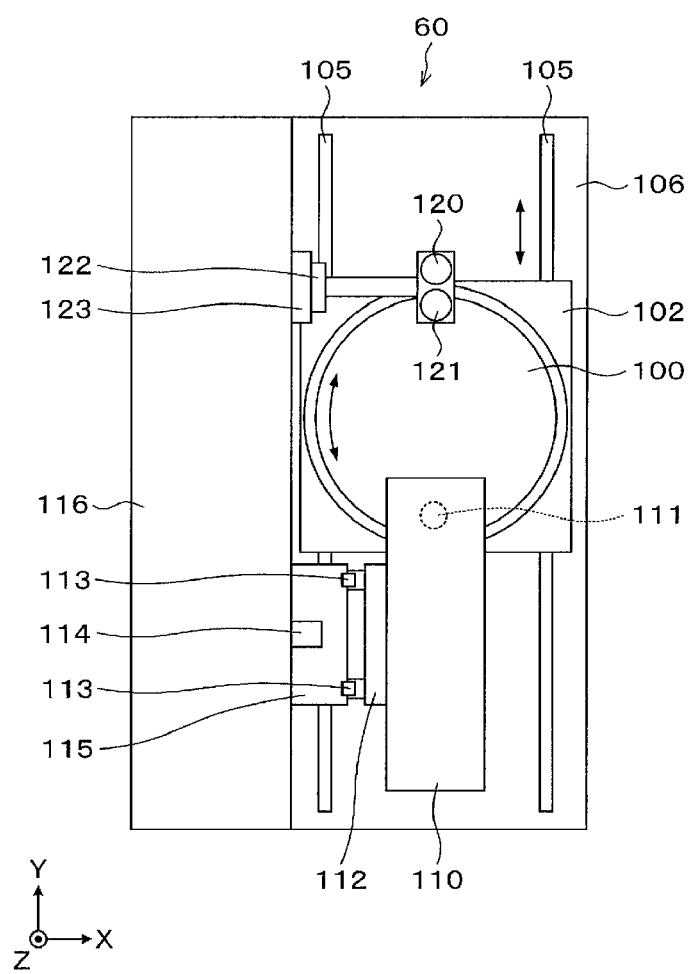
FIG. 4 is a plan view illustrating a schematic configuration of a modifying apparatus.
Figure 5:
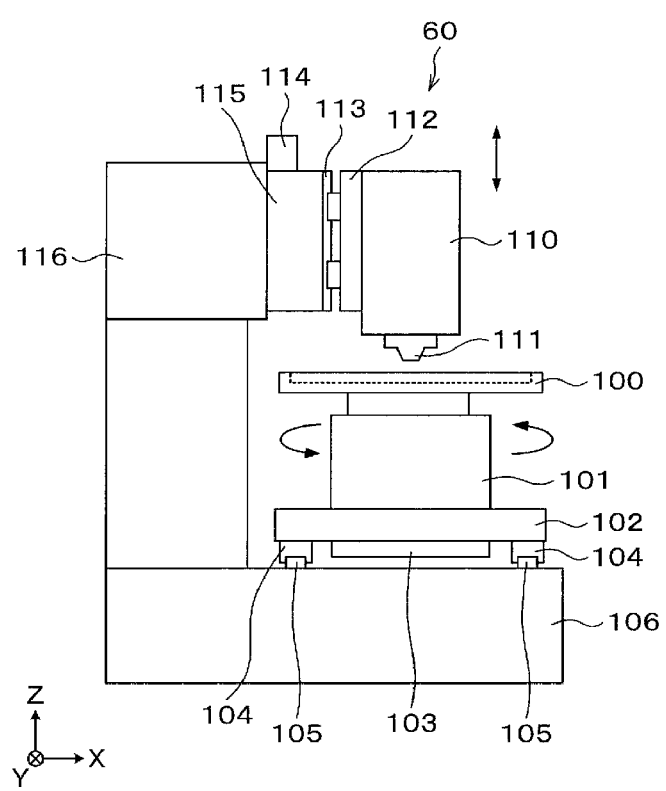
FIG. 5 is a side view illustrating the schematic configuration of the modifying apparatus.

Now, the aforementioned modifying apparatus 60 will be described. FIG. 4 is a plan view illustrating a schematic configuration of the modifying apparatus 60. FIG. 5 is a side view illustrating the schematic configuration of the modifying apparatus 60.

The modifying apparatus 60 is equipped with a chuck 100 as a holder configured to hold the combined wafer W on a top surface thereof. The chuck 100 is configured to attract and hold the support wafer S in the state that the processing target wafer W is placed at an upper side and the support wafer S is placed at a lower side. The chuck 100 is supported on a slider table 102 with an air bearing 101 therebetween. A rotating mechanism 103 is provided at a bottom surface side of the slider table 102. The rotating mechanism 103 incorporates therein, for example, a motor as a driving source. The chuck 100 is configured to be rotated around a vertical axis by the rotating mechanism 103 via the air bearing 101 therebetween. The slider table 102 is configured to be moved by a moving mechanism 104, which is provided at a bottom surface side thereof, along a rail 105 which is provided on a base 106 and elongated in the Y-axis direction. Further, though not particularly limited, a driving source of the moving mechanism 104 may be, for example, a linear motor.

A laser head 110 as a modifying device is provided above the chuck 100. The laser head 110 has a lens 111. The lens 111 is a cylindrical member provided on a bottom surface of the laser head 110, and is configured to radiate the laser light to the processing target wafer W held by the chuck 100.

The laser head 110 concentrates and radiates the laser light having a wavelength featuring transmissivity for the processing target wafer W to required positions within the processing target wafer W as high-frequency laser light in a pulse shape oscillated from a laser light oscillator (not shown). Accordingly, portions within the processing target wafer W to which the laser light is concentrated are modified, so that the peripheral modification layer and the internal modification layer are formed.

The laser head 110 is supported at a supporting member 112. The laser head 110 is configured to be moved up and down by an elevating mechanism 114 along a vertically elongated rail 113. Further, the laser head 110 is configured to be moved in the Y-axis direction by a moving mechanism 115. Each of the elevating mechanism 114 and the moving mechanism 115 is supported at a supporting column 116.

Above the chuck 100, a macro-camera 120 and a micro-camera 121 are provided at a positive Y-axis side of the laser head 110. For example, the macro-camera 120 and the micro-camera 121 are formed as one body, and the macro-camera 120 is provided at a positive Y-axis side of the micro-camera 121. The macro-camera 120 and the micro-camera 121 are configured to be moved up and down by an elevating mechanism 122, and also configured to be moved in the Y-axis direction by a moving mechanism 123.

The macro-camera 120 serves to image an outer end portion of the processing target wafer W (combined wafer T). The macro-camera 120 is equipped with, for example, a coaxial lens, and radiates visible light, for example, red light and receives reflection light from a target object. For example, the macro-camera 120 has an image magnification of two times.

The micro-camera 121 serves to image a peripheral portion of the processing target wafer W, and also images a boundary between the bonding region Aa and the non-bonding region Ab. The micro-camera 121 is equipped with, for example, a coaxial lens, and radiates infrared light (IR light) and receives reflection light from a target object. By way of example, the micro-camera 121 has an image magnification of 10 times. A field of view of the micro-camera 121 is about ⅕ of a field of view of the macro-camera 120, and a pixel size of the micro-camera 121 is about ⅕ of a pixel size of the macro-camera 120.

Figure 6:
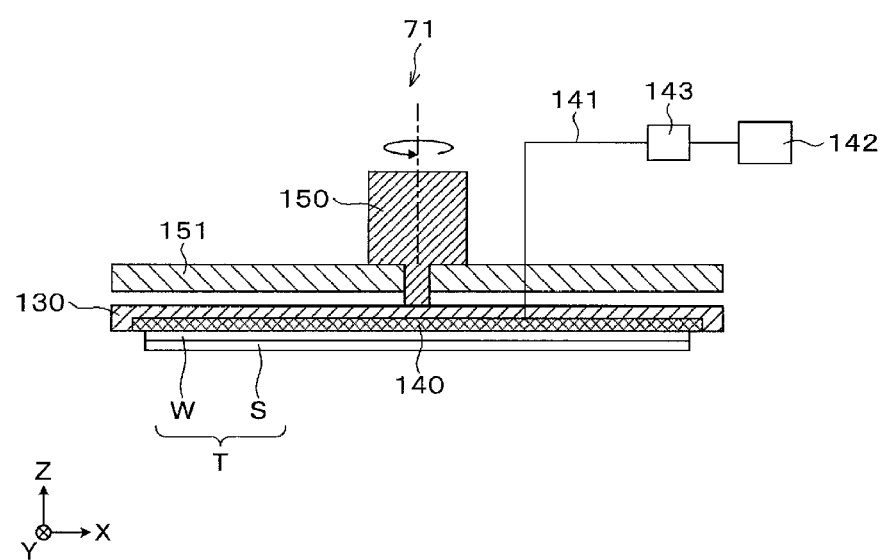
FIG. 6 is a longitudinal cross sectional view illustrating a schematic configuration of a transfer arm.

Now, the transfer arm 71 of the aforementioned wafer transfer device 70 will be explained. FIG. 6 is a longitudinal cross sectional view illustrating a schematic configuration of the transfer arm 71.

The transfer arm 71 is equipped with a circular attraction plate 130 having a diameter larger than a diameter of the combined wafer T. A holder 140 configured to hold the rear surface Wb of the processing target wafer W is provided in a bottom surface of the attraction plate 130.

A suction line 141 for suctioning the processing target wafer W is connected to the holder 140, and the suction line 141 is connected to a suction mechanism 142 such as, but not limited to, a vacuum pump. The suction line 141 is provided with a pressure sensor 143 configured to measure a suction pressure. Though a configuration of the pressure sensor 143 is not particularly limited, a diaphragm pressure sensor may be used.

A rotating mechanism 150 configured to rotate the attraction plate 130 around a vertical axis is provided on a top surface of the attraction plate 130. The rotating mechanism 150 is supported at a supporting member 151. Further, the supporting member 151 (rotating mechanism 150) is supported at the arm member 72.

Figure 7:
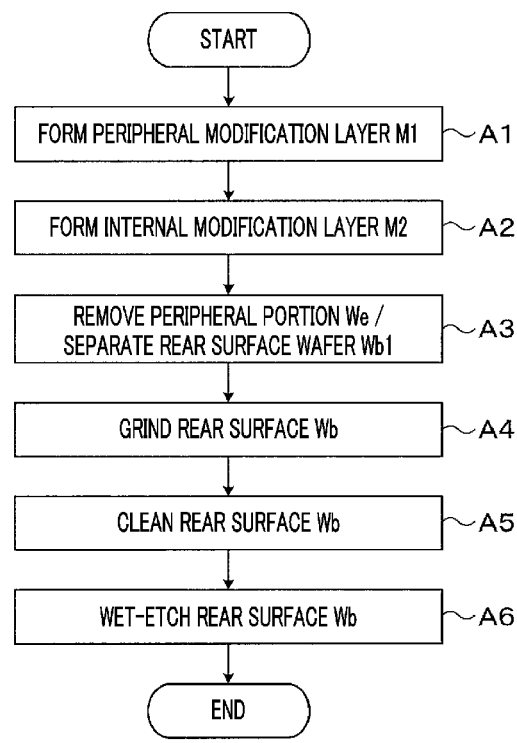
FIG. 7 is a flowchart illustrating main processes of a wafer processing according to the exemplary embodiment.

Now, a wafer processing performed by using the wafer processing system 1 configured as described above will be discussed. FIG. 7 is a flowchart illustrating main processes of the wafer processing. FIG. 8A to FIG. 8E are explanatory diagrams illustrating the main processes of the wafer processing. In the present exemplary embodiment, the combined wafer T is previously formed by bonding the processing target wafer W and the support wafer S in a bonding apparatus (not shown) at the outside of the wafer processing system 1.

Figure 8A:
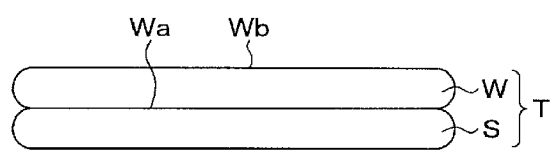
FIG. 8A to FIG. 8E are explanatory diagrams illustrating the main processes of the wafer processing according to the exemplary embodiment.

First, the cassette Ct accommodating therein the multiple number of combined wafers T shown in FIG. 8A is placed on the cassette placing table 10 of the carry-in/out station 2.

Figure 8B:
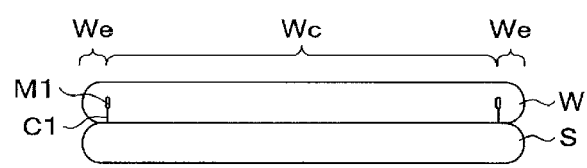
Figure 8C:
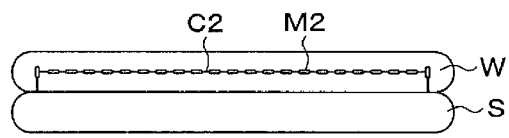

Then, the combined wafer T is taken out of the cassette Ct by the wafer transfer device 20, and transferred into the transition device 30. Subsequently, the combined wafer T is taken out of the transition device 30 by the wafer transfer device 50, and transferred into the modifying apparatus 60. In the modifying apparatus 60, a peripheral modification layer M1 is formed inside the processing target wafer W as illustrated in FIG. 8B (process A1 of FIG. 7), and, also, an internal modification layer M2 is formed as illustrated in FIG. 8C (process A2 of FIG. 7). The peripheral modification layer M1 serves as a starting point when the peripheral portion We is removed in the edge trimming. The internal modification layer M2 serves as a starting point for thinning the processing target wafer W.

In the modifying apparatus 60, the combined wafer T is first carried in from the wafer transfer device 50 to be held by the chuck 100. Then, the chuck 100 is moved to a macro-alignment position. The macro-alignment position is a position where the macro-camera 120 is capable of imaging the outer end portion of the processing target wafer W.

Thereafter, the outer end portion of the processing target wafer W is imaged by the macro-camera 120 in 360 degrees in the circumferential direction of the processing target wafer W. The obtained image is outputted to the control device 90 from the macro-camera 120.

In the control device 90, a first eccentric amount between a center Cc of the chuck 100 and a center Cw of the processing target wafer W is calculated from the image obtained by the macro-camera 120. Further, in the control device 90, a moving amount of the chuck 100 is calculated based on the first eccentric amount to correct a Y-axis component of the first eccentric amount. The chuck 100 is moved in the Y-axis direction based on the calculated moving amount, and then moved to a micro-alignment position. The micro-alignment position is a position where the micro-camera 121 is capable of imaging the peripheral portion of the processing target wafer W. Here, the field of view of the micro-camera 121 is smaller (about ⅕) than the field of view of the macro-camera 120, as stated above. Thus, if the Y-axis component of the first eccentric amount is not corrected, the peripheral portion of the processing target wafer W may not be included in an angle of view of the micro-camera 121, resulting in a failure to image the peripheral portion of the processing target wafer W with the micro-camera 121. For the reason, the correction of the Y-axis component based on the first eccentric amount is performed to move the chuck 100 to the micro-alignment position.

Subsequently, the boundary between the bonding region Aa and the non-bonding region Ab is imaged by the micro-camera 121 in 360 degrees in the circumferential direction of the processing target wafer W. The obtained image is outputted to the control device 90 from the micro-camera 121.

In the control device 90, a second eccentric amount between the center Cc of the chuck 100 and a center Ca of the bonding region Aa is calculated from the image obtained by the micro-camera 121. Further, in the control device 90, a position of the chuck 100 with respect to the peripheral modification layer M1 is decided based on the second eccentric amount such that the center of the bonding region Aa and the center of the chuck 100 are aligned with each other.

Figure 9:
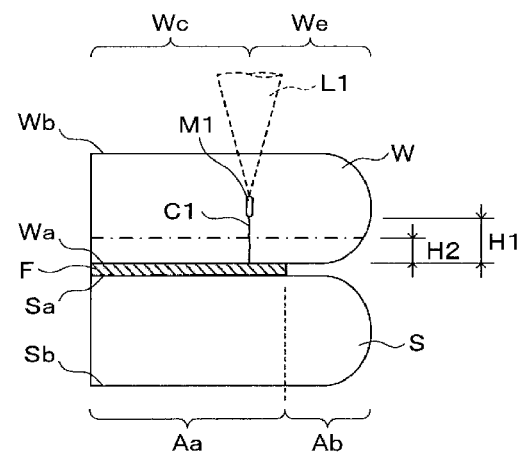
FIG. 9 is an explanatory diagram showing a state in which a peripheral modification layer is being formed in a processing target wafer.
Figure 10:
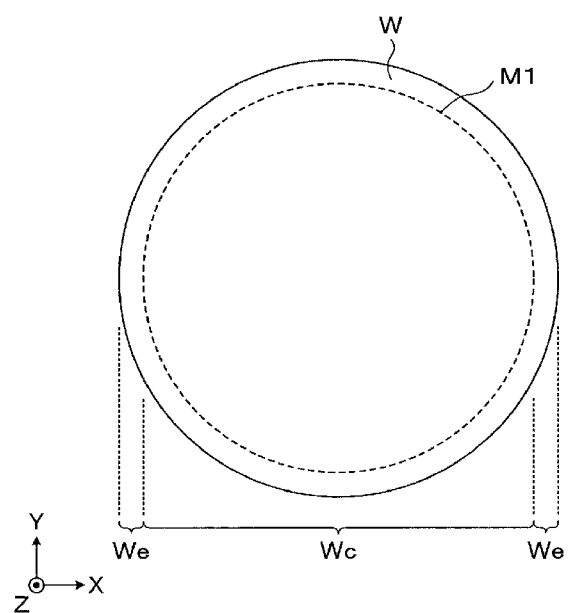
FIG. 10 is an explanatory diagram showing a state in which the peripheral modification layer is formed in the processing target wafer.

Subsequently, as illustrated in FIG. 9 and FIG. 10, by radiating laser light L1 (laser light L1 for periphery) from the laser head 110, the peripheral modification layer M1 is formed at a boundary between the peripheral portion We and a central portion We of the processing target wafer W (process A1 of FIG. 7). The peripheral modification layer M1 is formed at an inner side than an outer end of the bonding region Aa in the diametrical direction.

A lower end of the peripheral modification layer M1 formed by the laser light L1 is located above a target surface (indicated by a dashed line in FIG. 9) of the processing target wafer W after being thinned. That is, a distance H1 between the lower end of the peripheral modification layer M1 and the front surface Wa of the processing target wafer W is larger than a target thickness H2 of the processing target wafer W after being thinned. In this case, the peripheral modification layer M1 is not left in the processing target wafer W after being thinned. Further, within the processing target wafer W, a crack C1 from the peripheral modification layer M1 advances only to the front surface Wa, and does not reach the rear surface Wb.

In the process A1, according to the position of the chuck 100 decided by the control device 90, the chuck 100 is rotated by the rotating mechanism 103 and moved in the Y-axis direction by the moving mechanism 104 such that the center of the bonding region Aa and the center of the chuck 100 are aligned with each other. At this time, the rotation of the chuck 100 and the movement of the chuck 100 in the Y-axis direction are synchronized.

While rotating and moving the chuck 100 (processing target wafer W) as stated above, the laser light L1 is radiated to the inside of the processing target wafer W from the laser head 110. That is, the peripheral modification layer M1 is formed while correcting the second eccentric amount. As a result, the peripheral modification layer M1 is formed in a ring shape to be concentric with the bonding region Aa. Thus, the peripheral portion We can be appropriately removed, starting from the peripheral modification layer M1.

Further, in the present exemplary embodiment, if the second eccentric amount includes an X-axis component, this X-axis component is corrected by rotating the chuck 100 while moving it in the Y-axis direction. Meanwhile, if the second eccentric amount does not include the X-axis component, the chuck 100 only needs to be moved in the Y-axis direction without being rotated.

Figure 11:
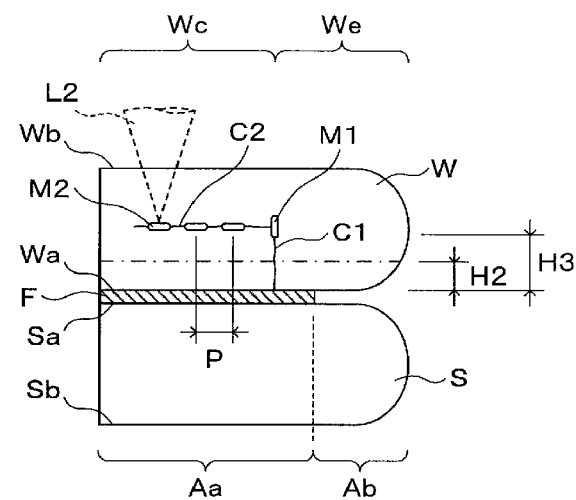
FIG. 11 is an explanatory diagram showing a state in which an internal modification layer is being formed in the processing target wafer.
Figure 12:
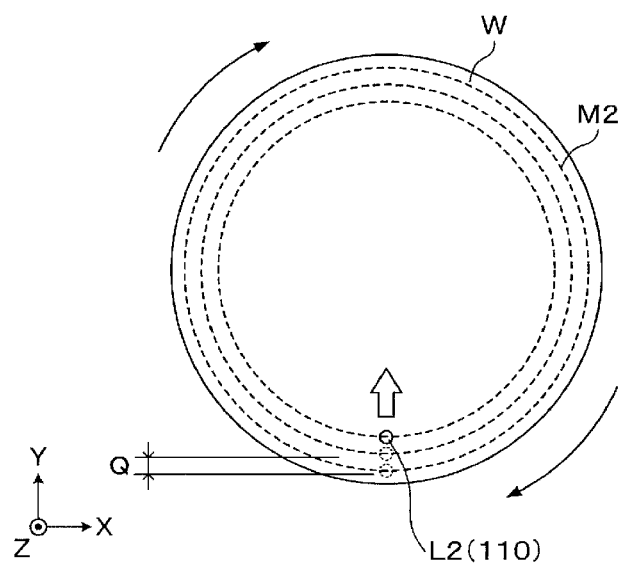
FIG. 12 is an explanatory diagram showing a state in which the internal modification layer is being formed in the processing target wafer.

Next, as illustrated in FIG. 11 and FIG. 12, by radiating laser light L2 (laser light L2 for internal surface) from the laser head 110, the internal modification layer M2 is formed along a plane direction of the processing target wafer W (process A2 of FIG. 7). Black arrows shown in FIG. 12 indicate a rotation direction of the chuck 100.

A lower end of the internal modification layer M2 is located slightly above the target surface (indicated by a dashed line in FIG. 11) of the processing target wafer W after being thinned. That is, a distance H3 between the lower end of the internal modification layer M2 and the front surface Wa of the processing target wafer W is slightly larger than the target thickness H2 of the processing target wafer W after being thinned. Within the processing target wafer W, a crack C2 develops from the internal modification layer M2 along the plane direction. Here, the crack C2 only progresses inside the peripheral modification layer M1.

In the process A2, by radiating the laser light L2 to the inside of the processing target wafer W from the laser head 110 while rotating the chuck 100 (processing target wafer W) one round (360 degrees), the internal modification layer M2 is formed in a ring shape. Then, the laser head 110 is moved inwards in the diametrical direction of the processing target wafer W (in the Y-axis direction). By repeating the formation of the ring-shaped internal modification layer M2 and the inward moving of the laser head 110 in the diametrical direction, the internal modification layer M2 is formed in the plane direction. Details of the method of forming the internal modification layer M2 in the process A2 will be elaborated later.

Although the laser head 110 is moved in the Y-axis direction to form the internal modification layer M2 in the present exemplary embodiment, the chuck 100 may be moved in the Y-axis direction. Further, although the chuck 100 is rotated to form the internal modification layer M2, it may be possible to rotate the laser head 110 relative to the chuck 100 by moving the laser head 110.

Subsequently, once the internal modification layer M2 is formed in the processing target wafer W, the combined wafer T is carried out by the wafer transfer device 70.

Figure 8D:
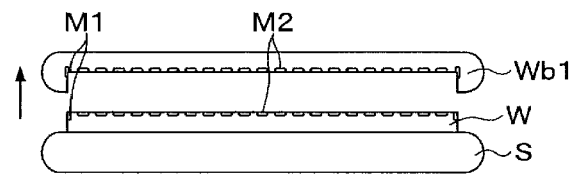

Then, the combined wafer T is transferred to the processing apparatus 80 by the wafer transfer device 70. First, in the processing apparatus 80, when the combined wafer T is delivered from the transfer ram 71 onto the chuck 83, the rear surface Wb side of the processing target wafer W (hereinafter, referred to as "rear surface wafer Wb1") is separated starting from the peripheral modification layer M1 and the internal modification layer M2 (process A3 of FIG. 7), as illustrated in FIG. 8D. At this time, the peripheral portion We is also removed from the processing target wafer W.

In the process A3, the support wafer S is attracted to and held by the chuck 83 while the processing target wafer W is attracted to and held by the attraction plate 130 of the transfer arm 71, as illustrated in FIG. 13A. Then, the attraction plate 130 is rotated, so that the rear surface wafer Wb1 is cut along the peripheral modification layer M1 and the internal modification layer M2. Thereafter, the attraction plate 130 is raised in the state that the rear surface wafer Wb1 is attracted to and held by the attraction plate 130, so that the rear surface wafer Wb1 is separated from the processing target wafer W, as illustrated in FIG. 13B. At this time, by measuring a pressure for suctioning the rear surface wafer Wb1 with the pressure sensor 143, presence or absence of the rear surface wafer Wb1 is detected. Thus, it can be checked whether the rear surface wafer Wb1 is separated from the processing target wafer W. Further, the separated rear surface wafer Wb1 is collected to the outside of the wafer processing system 1. In the process A3 as described above, the rear surface wafer Wb1 is separated as one body with the peripheral portion We. That is, the removal of the peripheral portion We and the separation of the processing target wafer W are performed at the same time.

Moreover, although the processing target wafer W is separated by raising the attraction plate 130 after rotating the attraction plate 130, the rotation of the attraction plate 130 may be omitted, and the processing target wafer W may be separated only through the raising of the attraction plate 130.

Figure 8E:

Subsequently, the chuck 83 is moved to the processing position B0. Then, the rear surface Wb of the processing target wafer W held by the chuck 83 is ground by the grinding unit 84, as shown in FIG. 8E to thereby remove the internal modification layer M2 and the peripheral modification layer M1 left on the rear surface Wb (process A4 of FIG. 7). In the process A4, by rotating the processing target wafer W and the grinding whetstone in the state that the rear surface Wb is in contact with the grinding whetstone, the rear surface Wb is ground. Further, the rear surface Wb of the processing target wafer W may be then cleaned by a cleaning liquid from a cleaning liquid nozzle (not shown).

Thereafter, the combined wafer T is transferred to the cleaning apparatus 41 by the wafer transfer device 70. In the cleaning apparatus 41, the ground rear surface Wb of the processing target wafer W is scrub-cleaned (process A5 of FIG. 7). Further, in the cleaning apparatus 41, the rear surface Sb of the support wafer S as well as the rear surface Wb of the processing target wafer W may be cleaned.

Afterwards, the combined wafer T is transferred to the etching apparatus 40 by the wafer transfer device 50. In the etching apparatus 40, the rear surface Wb of the processing target wafer W is wet-etched by the chemical liquid (process A6 of FIG. 7). A grinding mark may be formed on the rear surface Wb ground by the aforementioned processing apparatus 80. In the process A6, the grinding mark can be removed by performing the wet-etching, so that the rear surface Wb can be flattened.

Then, the combined wafer T after being subjected to all the required processings is transferred to the transition device 30 by the wafer transfer device 50, and then transferred into the cassette Ct on the cassette placing table 10 by the wafer transfer device 20. Accordingly, a series of the processes of the wafer processing in the wafer processing system 1 is ended.

Further, in the present exemplary embodiment, the removing of the internal modification layer M2 and the peripheral modification layer M1 are carried out by grinding the rear surface Wb of the processing target wafer W in the process A4 after the processing target wafer W is separated in the process A3. However, the removing of the internal modification layer M2 and the peripheral modification layer M1 may be accomplished by the wet-etching in the process A6. In this case, the process A4 may be omitted.

Furthermore, if the internal modification layer M2 and the peripheral modification layer M1 are removed by grinding the rear surface Wb of the processing target wafer W in the process A4, the wet-etching in the process A6 may be omitted.

Now, the method of forming the internal modification layer M2 in the process A2 will be described in detail with reference to FIG. 14 to FIG. 16. In the process A2, multiple internal modification layers M2 each having a ring shape as described above are formed in the diametrical direction. In the following description, each ring may sometimes be referred to as a processing line for the convenience of explanation. Further, as shown in FIG. 11 and FIG. 12, a distance between every two neighboring internal modification layers M2 on the processing line in the circumferential direction is referred to as a circumferential distance P (pulse pitch), and a distance between every two neighboring processing lines in the diametrical direction is referred to as a diametrical distance Q (index pitch).

Here, the present inventor has considered increasing productivity by shortening a processing time of the process A2. To reduce the processing time of the process A2, the repetition number of the radiation of the laser light L2 per unit time needs to be increased. However, this method still has limitations in increasing a frequency of the laser light L2 radiated from the laser head 110.

Thus, the present inventor has considered reducing the repetition number of the radiation of the laser light L2 (that is, the number of the internal modification layers M2) by increasing the circumferential distance P and the diametrical distance Q shown in FIG. 11 and FIG. 12. In order to separate (remove) the rear surface wafer Wb1 from the processing target wafer W appropriately in the process A3, the crack C2 which serves as the starting point of the separation needs to be developed properly. For example, if the circumferential distance P is too large, the cracks C2 from the internal modification layers M2 adjacent to each other in the circumferential direction may not be connected. Likewise, if the diametrical distance Q is too large, the cracks C2 from the internal modification layers M2 adjacent to each other in the diametrical direction may not be connected, either. Through many researches, the present inventor has found out that the cracks C2 are allowed to develop properly if the circumferential distance P is 15 μm and the diametrical distance Q is 30 μm when energy of the laser light L2 is 18.5 μJ, for example, so that the processing wafer W can be separated.

Meanwhile, the rear surface wafer Wb1 may not be properly separated at the central portion of the processing target wafer W. For example, to maintain the circumferential distance P constant under the condition that the frequency of the laser light L2 is kept constant, a rotation speed of the chuck 100 needs to be increased as a radiation position of the laser light L2 is shifted from an outer side to an inner side in the diametrical direction. If, however, the rotation speed of the chuck 100 reaches an upper limit, the circumferential distance P decreases as the radiation position of the laser light L2 is moved inwards in the diametrical direction, and, as a result, the internal modification layers M2 may be overlapped on the same processing line at the central portion of the processing target wafer W. Resultantly, the central portion of the processing target wafer W may not be separated.

The reason for the failure to separate the central portion of the processing target wafer W will be explained in further detail. If the internal modification layer M2 is formed by the radiation of the laser light L2, the internal modification layer M2 expands. A stress generated during this expansion causes the crack C2. If, however, the internal modification layers M2 are overlapped, a next (second) laser light L2 is radiated to the first-formed internal modification layer M2, making it difficult for the crack 2 to develop in the diametrical direction. Further, for example, when the circumferential distance P is smaller than a required threshold value even if the internal modification layers M2 are not overlapped, the next (second) laser light L2 is radiated to the crack C2 which is developing from the first-formed internal modification layer M2. In this case, since the laser light L2 is radiated to the crack C2 through which the stress is already released, it may also be difficult for the crack C2 to develop in the diametrical direction. As stated, since the crack C2 cannot develop properly at the central portion of the processing target wafer W, this central portion may not be separated.

In view of the foregoing, the present inventor has come to consider the following two methods as a way to separate the central portion of the processing target wafer W.

The first method is to set the diametrical distance Q to be small at the central portion of the processing target wafer W. Even if the length of the crack C2 developed from each internal modification layer M2 is shortened as stated above, there will be no problem as long as the cracks C2 from the internal modification layers M2 adjacent to each other in the diametrical direction are connected. Thus, the diametrical distance Q is set to be small.

The second method is to make the frequency of the laser light L2 radiated from the laser head 110 smaller. In this case, the circumferential distance P can be maintained equal to or larger than the threshold value, thus making it possible for the crack C2 to develop properly from each internal modification layer M2. The required threshold value for the circumferential distance P is determined by the energy of the laser light L2. For example, if the energy of the laser light L2 is 18.5 μJ, the required threshold value is 7.5 μm.

As stated above, in order to form the internal modification layers M2 in the entire wafer surface, the crack C2 needs to be developed properly. In the present exemplary embodiment, to meet such a requirement for the crack C2, the following first to third processes A21 to A23 are performed in forming the internal modification layer M2 in the process A2. Further, in the present exemplary embodiment, the energy of the laser light L2 radiated from the laser head 110 is 18.5 μJ, and the frequency of the laser light L2 is 180 kHz.

FIG. 14 is an explanatory diagram for describing the first process A21. In the first process A21, the internal modification layers M2 are formed in a first region R1 ranging from an edge of the processing target wafer W to a first boundary position B1.

In the first process A21, to keep the circumferential distance P constant at a first circumferential distance P1 (e.g., 15 μm) equal to or larger than the required threshold value (e.g., 7.5 μm), the rotation speed of the chuck 100 is increased as the laser head 110 is moved inwards in the diametrical direction. The laser head 110 is moved until the radiation position of the laser light L2 reaches the first boundary position B1. This first boundary position B1 is a position where the rotation speed of the chuck 100 reaches a maximum rotation speed (e.g., 1200 rpm).

The first boundary position B1 can be calculated. For example, when the frequency of the laser light L2 is 180 kHz; the maximum rotation speed of the chuck 100 is 1200 rpm; and the first circumferential distance P1 is maintained constant at 15 μm, the first boundary position B1 is calculated to be a position of 43.2 mm from the center of the processing target wafer W in the diametrical direction. That is, the rotation speed for maintaining the first circumferential distance P1 constant at 15 μm can be calculated based on the position of the laser light L2 in the diametrical direction, and the position where the calculated rotation speed reaches the maximum rotation speed is referred to as the first boundary position B1. This first boundary position B1 is calculated in advance before the wafer processing is performed.

In the first process A21, the diametrical distance Q is a first diametrical distance Q1 (e.g., 30 μm).

Figure 15:
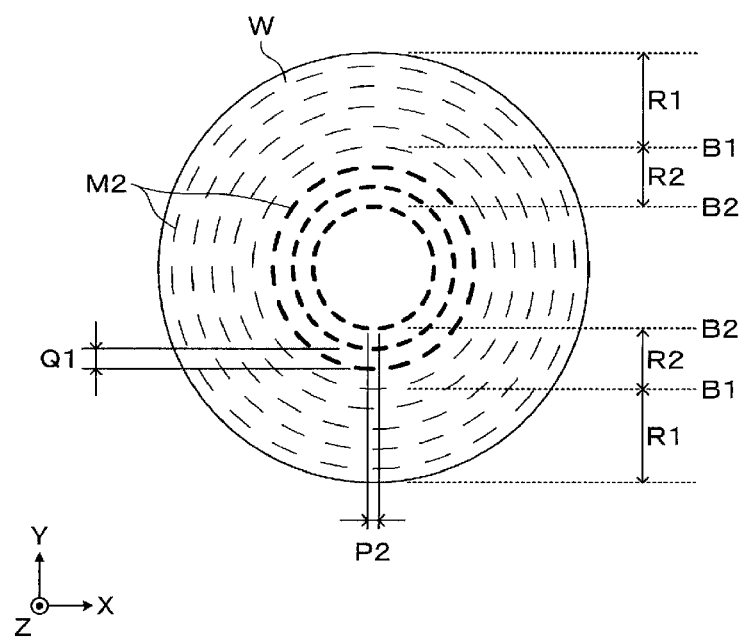
FIG. 15 is an explanatory diagram showing a state in which the internal modification layer is being formed in the processing target wafer.

FIG. 15 is an explanatory diagram for describing the second process A22. In the second process A22, the internal modification layers M2 are formed in a second region R2 ranging from the first boundary position 131 to a second boundary position B2.

In the second region R2, even if the rotation speed of the chuck 100 is maintained at the maximum rotation speed (e.g., 1200 rpm), the circumferential distance P becomes smaller than the first circumferential distance P1 (e.g., 15 μm) as the laser head 110 is moved inwards in the diametrical direction. Here, however, as stated above, the crack C2 is still allowed to develop until the circumferential distance P reaches a second circumferential distance P2 (e.g., 7.5 μm) which is the required threshold value. Thus, in the process A22, while rotating the chuck 100 at the maximum rotation speed, the laser head 110 is moved until the radiation position of the laser light L2 reaches the second boundary position B2. This second boundary position B2 is a position where the circumferential distance P reaches the second circumferential distance P2.

The second boundary position B2 can be calculated. For example, when the frequency of the laser light L2 is 180 kHz; and the maximum rotation speed of the chuck 100 is 1200 rpm, the second boundary position B2 is calculated to be a position of 22 mm from the center of the processing target wafer W in the diametrical direction. That is, the circumferential distance P can be calculated based on the position of the laser light L2 in the diametrical direction, and the position where the calculated circumferential distance P reaches the second circumferential distance P2 is referred to as the second boundary position B2. That is to say, the second boundary position B2 is set to be the position where the circumferential distance P becomes the second circumferential distance P2 by changing a relationship between the rotation speed of the chuck 100 and the circumferential distance P. In addition, the second boundary position B2 is calculated in advance before the wafer processing is performed.

Further, in the second process A22 as well, the diametrical distance Q is the first diametrical distance Q1 (e.g., 30 μm), the same as in the process A21.

Figure 16:
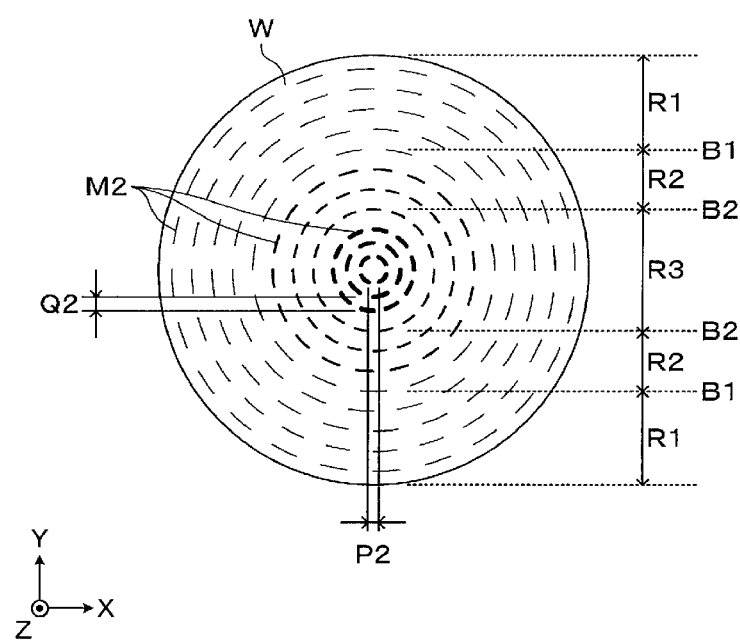
FIG. 16 is an explanatory diagram showing a state in which the internal modification layer is being formed in the processing target wafer.

FIG. 16 is an explanatory diagram for describing the third process A23. In the third process A23, the internal modification layers M2 are formed in a third region R3 inside the second boundary position B2 in the diametrical direction.

In the third process A23, either the diametrical distance Q is set to be smaller (first method), or the frequency of the laser light L2 is set to be smaller (second method). Alternatively, these two methods may be both performed.

The first method will be explained. To reduce the diametrical distance Q, the first diametrical distance Q1 of, e.g., 30 μm in the first and second regions R1 and R2 is reduced to a second diametrical distance Q2 of, e.g., 10 μm to 15 μm. In such a case, the diametrical distance Q is reduced. Accordingly, even if the length of the crack C2 developed from each internal modification layer M2 in the diametrical direction is shortened, the cracks C2 from the internal modification layers M2 adjacent to each other in the diametrical direction can be connected. Therefore, even the central portion of the processing target wafer W can be separated appropriately. Moreover, how much the diametrical distance Q is to be reduced may be set in advance to allow the central portion of the processing target wafer W to be separated properly as well.

The second method will be described. When the frequency of the laser light L2 radiated from the laser head 110 is reduced, the circumferential distance P may be maintained at the first circumferential distance P1. In such a case, the crack C2 can be appropriately developed from each internal modification layer M2. Accordingly, the central portion of the processing target wafer W can be removed appropriately. Furthermore, how much the frequency of the laser light L2 is to be reduced may be set in advance to allow the central portion of the processing target wafer W to be separated.

Here, if the diametrical distance Q is reduced, it may cause an increase of the number of the internal modification layers M2 to be formed, which results in a longer processing time. Further, if the frequency of the laser light L2 is reduced, it may also cause an increase of the number of the internal modification layers M2 to be formed, which results in an increase of the processing time as well. In view of this drawback, in the present exemplary embodiment, a timing for reducing the diametrical distance Q or a timing for reducing the frequency of the laser light L2 is set to a timing when the laser light L2 reaches the second boundary position B2. Therefore, the third region R3 can be minimized. Therefore, the processing time can be shortened, and the productivity can be improved.

According to the above-described exemplary embodiment, in the third process A23, the diametrical distance Q is reduced, and/or the frequency of the laser light L2 is reduced (while maintaining the circumferential distance P constant). As a result, in the third region R3, the crack C2 can be developed appropriately, making it possible to separate the rear surface wafer Wb1 from the processing target wafer W appropriately.

In the first process A21, since the circumferential distance P and the diametrical distance Q are set to be as large as possible, the processing time can be reduced. Further, in the second process A22, since the rotation speed of the chuck 100 reaches the maximum rotation speed, the circumferential distance P is reduced. Since, however, the diametrical distance Q and the frequency of the laser light L2 are maintained constant, the increase of the processing time can be minimized. Furthermore, in the third process A23, as the priority is put on allowing the crack C2 to develop properly, the processing time is increased. Since, however, the third region R3 is minimized, the increase of the processing time can be minimized. Thus, the processing time is reduced, so that the throughput can be improved and the productivity can be further enhanced.

In addition, in the processing target wafer W, ease of the progress of the crack C2 may vary depending on crystal orientation of the silicon, and the length by which the crack C2 develops may not be uniform. Even if the length of the development of the crack C2 varies, the cracks C2 can be properly connected if the method of the present exemplary embodiment is used.

Figure 17:
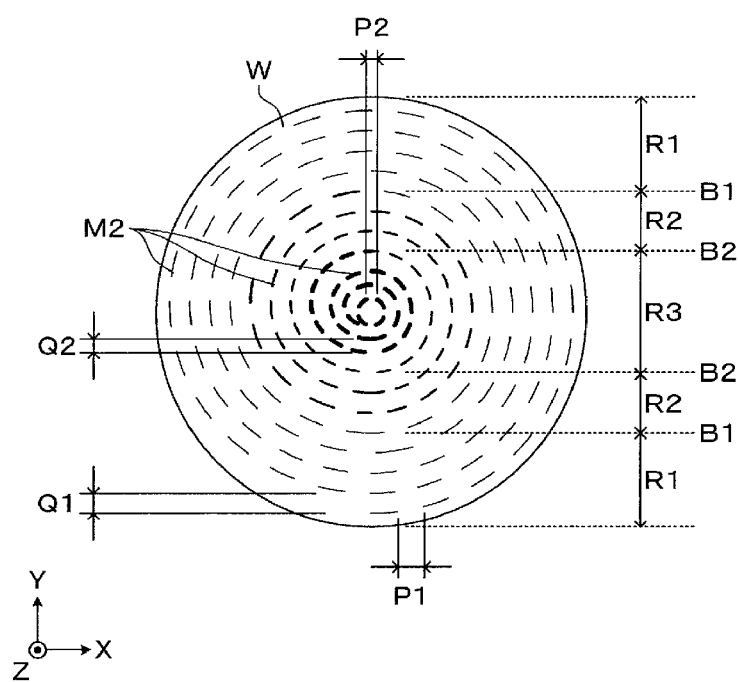
FIG. 17 is an explanatory diagram showing a state in which an internal modification layer is being formed in a processing target wafer in another exemplary embodiment.

In the above-described exemplary embodiment, although the multiple ring-shaped internal modification layers M2 are formed in the process A2, the internal modification layer M2 may be formed in, for example, a spiral shape from an outer side to an inner side in the diametrical direction, as shown in FIG. 17. To be specific, while rotating the chuck 100 (processing target wafer W) and moving the laser head 110 in the Y-axis direction from the outer side toward the inner side of the processing target wafer W in the diametrical direction, the laser light L2 is radiated from the laser head 110 to the inside of the processing target wafer W.

Even in this case, the same as in the above-described exemplary embodiment, the first boundary position B1 and the second boundary position B2 may be calculated in advance, and the first to third processes A21 to A23 are performed in sequence in the first to third regions R1 to R3. As a result, the same effect as obtained in the above-described exemplary embodiment can be achieved.

Furthermore, in the above-described exemplary embodiment, although the internal modification layer M2 is formed from the outer side toward the inner side in the diametrical direction in the process A2, it may be formed vice versa, that is, from the inner side toward the outer side in the diametrical direction. That is, it may be possible to radiate the laser light L2 to the inside of the processing target wafer W from the laser head 110 while moving the laser head 110 from the inner side of the processing target wafer W toward the outer side thereof in the diametrical direction. In this case as well, at an outer side in the diametrical direction, by reducing the diametrical distance Q and/or reducing the frequency of the laser light L2 (while maintaining the circumferential distance P constant), the crack C2 is allowed to develop properly, making it possible to separate the rear surface wafer Wb1 from the processing target wafer W properly.

Further, in the above-described exemplary embodiment, although the removing of the peripheral portion We and the separation of the processing target wafer W are performed at the same time, they may be performed separately. In this case, in the wafer processing system 1, a periphery removing apparatus (not shown) configured to remove the peripheral portion We may be provided on top of, for example, the modifying apparatus 60. Although the way how to remove the peripheral portion We by the periphery removing apparatus is not particularly limited, the peripheral portion We may be removed by applying, for example, a physical impact thereto.

The above exemplary embodiment has been described for the case where the processing target wafer W and the support wafer S are directly bonded to each other. However, the processing target wafer W and the support wafer S may be bonded with an adhesive therebetween.

Furthermore, although the above exemplary embodiment has been described for the case where the processing target wafer W in the combined wafer T is thinned, the above exemplary embodiment may also be applied to thin a single sheet of wafer. By way of example, after thinning the single sheet of wafer W, this thinned wafer may be bonded to the support wafer S to produce the combined wafer T.

Moreover, although the exemplary embodiment has been described for the example where the processing target object is the silicon substrate, the kind of the processing target object is not limited thereto. By way of example, a glass substrate, a monocrystalline substrate, a polycrystalline substrate, an amorphous substrate, or the like may be selected as the processing target object, instead of the silicon substrate. As another example, an ingot, a base, a thin plate, or the like may be selected as the processing target object, instead of the substrate.

It should be noted that the exemplary embodiment is illustrative in all aspects and is not anyway limiting. The above-described exemplary embodiment may be omitted, replaced and modified in various ways without departing from the scope and the spirit of claims.

According to the exemplary embodiments, it is possible to improve the throughput of the thinning processing on the processing target object.

I claim:

1. A processing apparatus configured to process a processing target object, comprising:
   a holder configured to hold the processing target object;
   a laser head configured to radiate laser light to an inside of the processing target object held by the holder to form modification layers along a plane direction thereof;
   a rotating mechanism configured to rotate the holder and the laser head relatively;
   a moving mechanism configured to move the holder and the laser head relatively in a horizontal direction; and a controller configured to control the holder, the laser head, the rotating mechanism and the moving mechanism, wherein, the modification layers are formed by radiating the laser light to the inside of the processing target object from the laser head periodically while rotating the processing target object held by the holder relative to the laser head by the rotating mechanism and by moving the laser head relative to the holder in a diametrical direction by the moving mechanism, the controller calculates a boundary position of the laser light in the diametrical direction, the boundary position being a position where a circumferential distance between the modification layers becomes a required threshold value, and the controller controls the holder, the laser head, the rotating mechanism and the moving mechanism to reduce, in a moving direction of the laser head from the boundary position, a diametrical distance between the modification layers and/or to reduce a frequency of the laser light.

2. The processing apparatus of claim 1,
wherein the controller controls the holder, the laser head, the rotating mechanism and the moving mechanism to maintain the circumferential distance between the modification layers constant by increasing a relative rotation speed of the holder with respect to the laser head up to a maximum rotation speed while moving the laser head relative to the holder in the diametrical direction; to move the laser head relative to the holder in the diametrical direction until the laser light reaches the boundary position, while rotating the holder relative to the laser head at the maximum rotation speed; and to reduce the diametrical distance between the modification layers in the moving direction of the laser head from the boundary position and/or to reduce the frequency of the laser light.

3. The processing apparatus of claim 1,
wherein the controller calculates, as the boundary position, a position of the laser light in the diametrical direction where the circumferential distance between the modification layers becomes the required threshold value, by varying a relationship between a relative rotation speed of the holder with respect to the laser head and the circumferential distance between the modification layers.

4. The processing apparatus of claim 1,
wherein the required threshold value is determined based on energy of the laser light.

5. The processing apparatus of claim 1,
wherein the controller controls the holder, the laser head, the rotating mechanism and the moving mechanism to form the modification layers in a ring shape by radiating the laser light to the inside of the processing target object from the laser head periodically while rotating the processing target object held by the holder one round relative to the laser head; then, to move the laser head relative to the holder in the diametrical direction; and to form the modification layers along the plane direction by repeating the forming of the ring-shaped modification layers and the moving of the laser head in the diametrical direction.

6. The processing apparatus of claim 1,
wherein the controller controls the holder, the laser head, the rotating mechanism and the moving mechanism to form the modification layers in a spiral shape in the moving direction of the laser head by radiating the laser light to the inside of the processing target object from the laser head periodically while rotating the processing target object held by the holder relative to the laser head and moving the laser head relative to the holder in the diametrical direction.

7. The processing apparatus of claim 1,
wherein the processing target object is a combined substrate in which a first substrate and a second substrate are bonded to each other,
the holder is configured to hold the combined substrate from a second substrate side, and
the laser head forms the modification layers along the plane direction by radiating the laser light to an inside of the first substrate.

8. A processing method of processing a processing target object, comprising:
holding the processing target object with a holder;
forming modification layers in a plane direction by periodically radiating laser light to an inside of the processing target object from a laser head configured to radiate the laser light while rotating the processing target object held by the holder relative to the laser head and by moving the laser head relative to the holder in a diametrical direction,
wherein, in the forming of the modification layers, a boundary position of the laser light in the diametrical direction is calculated such that a circumferential distance between the modification layers becomes a required threshold value, and
in a moving direction of the laser head from the boundary position, a diametrical distance between the modification layers and/or a frequency of the laser light is reduced.

9. The processing method of claim 8, further comprising:
maintaining the circumferential distance between the modification layers constant by increasing a relative rotation speed of the holder with respect to the laser head up to a maximum rotation speed while moving the laser head relative to the holder in the diametrical direction;
moving the laser head relative to the holder in the diametrical direction until the laser light reaches the boundary position, while rotating the holder relative to the laser head at the maximum rotation speed; and
reducing the diametrical distance between the modification layers in the moving direction of the laser head from the boundary position and/or reducing the frequency of the laser light.

10. The processing method of claim 8,
wherein by varying a relationship between a relative rotation speed of the holder with respect to the laser head and the circumferential distance between the modification layers, a position of the laser light in the diametrical direction where the circumferential distance between the modification layers becomes the required threshold value is calculated as the boundary position.

11. The processing method of claim 8,
wherein the required threshold value is determined based on energy of the laser light.

12. The processing method of claim 8,
wherein forming the modification layers in a ring shape is performed by radiating the laser light to the inside of the processing target object from the laser head periodically while rotating the processing target object held by the holder one round relative to the laser head, moving the laser head relative to the holder in the diametrical direction is performed, and forming the modification layers along the plane direction is performed by repeating the forming of the ring-shaped modification layers and the moving of the laser head in the diametrical direction.

13. The processing method of claim 8, wherein the modification layers are formed in a spiral shape in the moving direction of the laser head by radiating the laser light to the inside of the processing target object from the laser head periodically while rotating the processing target object held by the holder relative to the laser head and moving the laser head relative to the holder in the diametrical direction.

14. The processing method of claim 8, wherein the processing target object is a combined substrate in which a first substrate and a second substrate are bonded to each other, the holder is configured to hold the combined substrate from a second substrate side, and the laser head forms the modification layers along the plane direction by radiating the laser light to an inside of the first substrate.

\* \* \* \* \*